(12) United States Patent
Edmunds et al.

(10) Patent No.: US 6,407,918 B1
(45) Date of Patent: Jun. 18, 2002

(54) SERIES-PARALLEL FAN SYSTEM

(75) Inventors: Howard Ross Edmunds, Roanoke; John Earl Bittner, Troutville, both of VA (US); Brent Christopher Teal, Carlsbad; Thanh Ngoc Nguyen, Poway, both of CA (US); Brian Matthew Aiken, Roanoke, VA (US); Christopher James McMenamin, Roanoke, VA (US); Andrew Gordon Phillip, Roanoke, VA (US); Christopher Todd Moore, Roanoke, VA (US); Kyle Craig Stott, Brooklyn, OH (US)

(73) Assignee: General Electric Company, Schenectady, NY (US)

(*) Notice: Subject to any disclaimer, the term of this patent is extended or adjusted under 35 U.S.C. 154(b) by 0 days.

(21) Appl. No.: 09/681,414

(22) Filed: Mar. 30, 2001

(51) Int. Cl.[7] .................................................. H05H 7/20
(52) U.S. Cl. ..................... 361/695; 62/259.2; 165/80.3; 165/122; 165/104.34; 454/184
(58) Field of Search ....................... 29/592.1; 62/259.2; 165/80.3, 121–126, 104.34; 174/16.1; 361/687, 695–697, 717–720; 454/184

(56) References Cited

U.S. PATENT DOCUMENTS

| | | | |
|---|---|---|---|
| 4,758,924 A | | 7/1988 | Dillon et al. |
| 4,774,631 A | * | 9/1988 | Okuyama et al. ............ 361/695 |
| 5,546,272 A | | 8/1996 | Moss et al. |
| 5,572,403 A | | 11/1996 | Mills .......................... 361/695 |
| 5,745,041 A | | 4/1998 | Moss |
| 5,949,646 A | * | 9/1999 | Lee et al. .................... 361/695 |
| 6,031,717 A | | 2/2000 | Baddour et al. |

* cited by examiner

*Primary Examiner*—Gregory Thompson
(74) *Attorney, Agent, or Firm*—Hunton & Williams; Kevin T. Duncan, Esq.

(57) ABSTRACT

An apparatus and method for providing a supply of air to cool electrical devices is provided. The apparatus comprises a two fan housings, each containing a number of fans arranged to blow air in a parallel fashion. The exhaust of one housing is connected to the intake of the other housing by a balancing plenum. The apparatus provides a sufficient supply of cooling air when one or more of the fans is inoperable. The device being cooled may be the power bridge of an exciter for a power generation system. A method for providing a supply of air to electrical devices is also provided.

40 Claims, 3 Drawing Sheets

SERIES-PARALLEL FAN SYSTEM

BACKGROUND OF INVENTION

The present invention relates generally to cooling systems for electrical equipment. More particularly, the present invention relates to a unique series-parallel fan system for cooling electrical equipment.

Many electrical devices require forced air cooling to ensure that the devices remain in their ideal operating temperature range. Fans are commonly used to provide cooling. In a typical system, one or more fans will induce airflow over one or more electrical devices, either by negative pressure (suction) or by positive pressure. The fans and electrical devices may be enclosed in housings that help contain and guide the airflow, thereby increasing the efficiency of the cooling system. Such systems may have fans in a parallel, in which case the fans each fan blows a separate mass of air to provide a combined airflow, or the system may operate in series, in which case two or more fans blow the same mass of air at different locations along the air stream.

An example of a serial fan system is provided in U.S. Pat. No. 5,546,272, issued to Moss, et al., which is incorporated herein by reference in its entirety and in a manner consistent with the present invention. In Moss ('272), two fans are provided at different locations along a common plenum. The fans are selected such that if one fan fails, the remaining fan will continue to provide adequate cooling, however, the patent does not provide for a high level of serviceability. Moss ('272) fails to disclose an apparatus having a fan assembly comprising several fans in parallel being in series with a second fan assembly comprising several fans in parallel.

An example of a parallel fan system is provided in U.S. Pat. No. 6,031,717, issued to Baddour, et al., which is incorporated herein by reference in its entirety and in a manner consistent with the present invention. In Baddour, several fans are placed to provide parallel airflow to a housing. Baddour recognizes that a failed fan will cause a "short circuit" in the cooling system by allowing air to recirculate back out of the failed fan opening. To prevent such problems, Baddour provides a flexible one-way flap that closes off the opening of a failed fan. Baddour fails to disclose a second assembly of parallel fans being located in series with the first assembly of parallel fans, and fails to disclose a common plenum connecting two assemblies of parallel fans.

U.S. Pat. No. 5,745,041, issued to Moss, discloses an apparatus for supplementing the airflow provided by an internal main cooling fan of a computer power supply. The apparatus has two or more fans arranged in parallel or series, which are installed in a plenum that fits over the power supply housing. In the case where parallel fans are used, each fan has a separate well portion of the plenum that defines the space between the main fan and each fan of the apparatus. Each fan, including the internal main fan has sufficient capacity to cool the system, providing several levels of redundancy, but there is no disclosure of providing serviceability features to allow quick replacement of a failed fan. Moss ('041) also fails to disclose an apparatus having a fan assembly comprising several fans in parallel being connected by a plenum in series with a second fan assembly comprising several fans in parallel. Moss ('041) also fails to disclose an apparatus that may be used with high voltage electrical devices.

Therefore, it is desirable to provide an apparatus for cooling electrical devices that provides adequate cooling, even when one of the components fails. It is also desirable for such an apparatus to have a highly serviceable construction to allow for quick and easy assembly and replacement of inoperable components, which may be accomplished with little or no downtime of the device being cooled by the apparatus. It is also desirable for such a cooling system to be able to cool high-voltage electrical devices, to operate efficiently, and to operate quietly.

BRIEF SUMMARY OF THE INVENTION

The present invention overcomes the problems discussed above, and provides additional advantages, by employing an apparatus for providing a supply of air for cooling electrical devices that comprises an assembly of parallel fans arranged in series with another assembly of parallel fans.

In one embodiment of the invention, an apparatus for providing a supply of air for cooling electrical devices includes a first fan housing, a second fan housing, and a balancing plenum connecting the first fan housing to the second fan housing. The first and second fan housings each have an open intake side and an open exhaust side, with the remainder of each hosing being substantially airtight. Each fan housing has a fan assembly in it. Each fan assembly has two or more fans, each of which is connected to a power supply, arranged to blow air in a parallel fashion. The fan assemblies are arranged to bring air in from the intake side of each fan housing and force it out of the exhaust side of each fan housing. The exhaust side of the first fan housing is attached, by the balancing plenum, to the intake side of the second fan housing, thereby arranging the two fan housings and the fans within them in series and creating a substantially airtight passage between the intake side of the first fan housing and the exhaust side of the second fan housing. The embodiment provides an adequate air supply when at least one fan is inoperable.

In one embodiment, the present invention may be used to cool high-voltage electrical devices. In one embodiment of the invention, the apparatus may be used to cool electrical power generation devices, such as the power bridge of an exciter for a power generator. In another embodiment of the invention, each fan assembly may have two fans. In another embodiment of the invention, each fan assembly may have three fans. In another embodiment of the invention, each fan assembly may have two sets of two fans. In yet another embodiment, each of the fans may be part of an individually-replaceable modular fan unit.

In one embodiment of the invention, a fan may be replaced without turning off the device that is being cooled by the apparatus. In another embodiment, a fan may be replaced in less than about three minutes.

In another embodiment of the invention, the fan housings and the balancing plenum may be made as integral units.

The present invention also comprises of a method for providing a supply of air for cooling electrical devices in which two or more sets of fan assemblies, which blow air in parallel fashion, are located in a series relationship with one another.

BRIEF DESCRIPTION OF DRAWINGS

The present invention can be understood more completely from the following Detailed Description of exemplary embodiments and the accompanying drawings, in which.

DETAILED DESCRIPTION

In general terms, the embodiments to be described include two parallel fan assemblies located in fan housings and connected to one another in series through a balancing plenum. "Parallel", as used herein in the context of fans, refers to fans which are generally in a side-by-side relationship and which blow separate air masses in the same general direction. "Series", as used herein in the context of fans, refers to fans which are generally in an end-to-end relationship and which blow the same air mass in the same general direction. A "plenum" is an airtight air passage, which may or may not be specially shaped or sized to provide benefits to the apparatus. Objects or connections which are described as "airtight" herein, are sealed such that relatively little air may pass through its airtight portions; for example, an airtight plenum would allow air to pass freely through its open ends, but relatively little air would pass through its walls or the seams between its walls. An embodiment of the present invention provides an apparatus that may be described as a "Series-Parallel" fan assembly because two sets of parallel fans are placed in series with one another.

Figure 1:
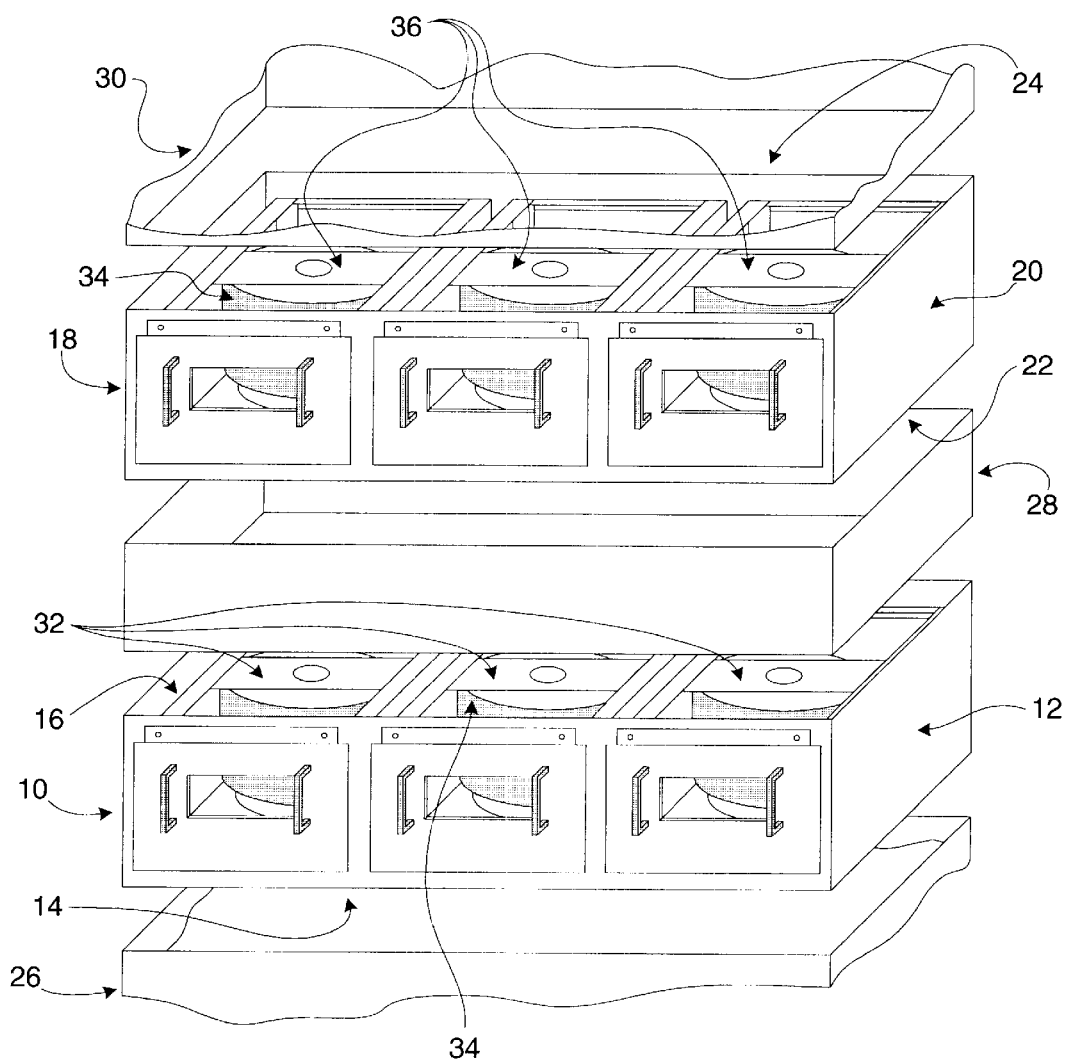
FIG. 1 is an isometric exploded view of an embodiment of the present invention.

FIG. 1 is an isometric exploded view of an embodiment of the present invention. In this embodiment, a first fan housing 10, containing a first fan assembly 32, is connected to a second fan housing 18, which contains a second fan assembly 36, by way of a balancing plenum 28.

The first fan housing 10 comprises four airtight sides 12, an open first intake side 14 (first intake), and an open first exhaust side 16 (first exhaust). The second fan housing 18, which may be identical in structure to the first fan housing 10 or may be substantially different, comprises four airtight sides 20, an open second intake side 22 (second intake), and an open second exhaust side 24 (second exhaust). Although this embodiment of the invention is described and depicted as having four sides arranged in a rectangular shape, it should be understood that the invention may have any number of sides and may have any suitable shape.

The first fan housing 10 may be connected to an intake plenum 26 at the first intake 14 by an airtight connection. The first fan housing 10 may also be connected directly to a device to be cooled, or it may open into free air. In one embodiment of the invention, the first fan housing 10 is attached to the power bridge unit of an exciter used in a power generation system. The balancing plenum 28, comprising two open ends and airtight sides, is attached to the first exhaust 16 at one open end by an airtight connection, and to the second intake 22 at the other open end by an airtight connection, and provides an airtight passage between the first and second fan housings 10, 18. The second fan housing 18 may be connected to an exhaust plenum 30 at the second exhaust 24 by an airtight connection.

The fabrication of the first and second fan housings 10, 18 and the intake, balancing and exhaust plenums 26, 28, 30 are known in the art. The housings and plenums may comprise a monocoque construction in which the panels bear a substantial part of the structural loads on the part, or they may comprise a space frame construction in which beam members are interconnected to provide a load bearing frame. A combination of both of these structural constructions may also be used. In addition, each of the various parts may comprise a different structural construction. The housings 10, 18 and plenums 26, 28, 30 may comprise any suitable material, such as flat or folded sheetmetal, steel beams, wood panels, and the like. In one embodiment, the balancing plenum 28 comprises a flexible accordion-like structure. In one embodiment, the first fan housing 10 is constructed to integrate with the device to be cooled.

The first and second fan housings 10, 18 may be connected to the various plenums 26, 28, 30 by any means known in the art. In one embodiment, fan housings 10, 18 comprise folded steel ledges that mate with similar ledges on the plenums 26, 28, 30 to provide a stable connection area (not shown). The connection areas may be secured to one another by use of fasteners, adhesives, and the like, or they may be held together by the weight of the various parts. In another embodiment, the connection areas may have retaining lips or tabs (not shown) or other shapes that provide a stable connection between the various parts. In yet another embodiment, the connections may be further sealed by use of flexible seals, such as gaskets and caulk-type sealants.

The housings 10, 18 and plenums 26, 28, 30 may further comprise additional features. In one embodiment, the housings 10, 18 and plenums 26, 28, 30 are insulated to reduce heat, noise or other emissions. In another embodiment, one or more of the housings 10, 18 and plenums 26, 28, 30 may further comprise access portals, windows, air bleed vents, bypass vents, mounting tabs, and other features. In another embodiment, one or more of the housings 10, 18 and plenums 26, 28, 30 may further comprise internal air passages, baffles, mufflers, shrouds and the like to control the airflow within them. In yet another embodiment, one or more of the housings 10, 18 and plenums 26, 28, 30 may comprise filters or screens disposed at one or more locations.

The housings 10, 18 may also be integrated with one or more of the plenums 26, 28, 30. In one embodiment, the balancing plenum 28 is an integral part of the first fan housing 10. In another embodiment, the balancing plenum 28 is an integral part of the second fan housing 10. In yet another embodiment, the first fan housing 10, the balancing plenum 28, and the second fan housing 18 are one integrated unit.

The first fan assembly 32 is inside the first fan housing 10. The first fan assembly 32 comprises several fans 34 arranged in a parallel configuration. The parallel fans 34 of the first fan assembly 32 are oriented such that they each draw air in from the first intake 14 and blow air out of the first exhaust 16.

The second fan assembly 36 is inside the second fan housing 18. The second fan assembly 36 comprises at least two fans 34 arranged in a parallel configuration. The parallel fans 34 of the second fan assembly 36 are oriented such that they each draw air in from the second intake 22 and blow air out of the second exhaust 14.

Each fan assembly 32, 36 has two or more fans 34, and one fan assembly may have more fans than the other. The fans 34 of each assembly may be arranged in a row, circle, grid, or any other suitable pattern to provide a parallel air flow. In an embodiment of the invention depicted in FIG. 1, the first and second fan assemblies each comprise a row of three fans 34 arranged to blow air in parallel. It is understood that other combinations and numbers of fans may be used with the present invention. In one embodiment of the invention, each fan assembly 32, 36 comprises two fans 34. In another embodiment of the invention, each fan assembly 32, 36 comprises two sets of two fans 34.

The fans 34, which may be variable-speed fans or fixed-speed fans, may be any suitable type of fan, such as axial fans, tube-axial fans, vane-axial fans, centrifugal fans, inline centrifugal fans, impellers (also known as "squirrel cage" fans), and the like. In one embodiment, the fan is an impeller having vanes with profiles that are backward inclined, radial, forward curved, radial-tipped, airfoil-shaped, or any other suitable profile. Each fan 34 may be a different type or size fan. In a one embodiment the fans 34 are impellers having backward curved vanes, which may provide high efficiency. In another embodiment, the fans 34 are impellers having forward curved vanes, which may provide quieter operation at lower operating speeds.

Each fan 34 is connected to a power supply by either a mechanical or electrical connection. In one embodiment, the fans 34 of each fan assembly 32, 36 are driven by one or more remote motors through a belt or other drive attachment. In another embodiment, each fan 34 is directly driven by a local motor. In this embodiment, each fan 34 may be directly connected to an electric motor, which is electrically connected to an electrical power source. In one embodiment of the invention, each fan 34 is connected to a fault indicator that sends a signal to a control system when the fan 34 becomes inoperable.

In one embodiment, each fan 34 may be separately disconnected from the power source without disconnecting the other fans 34. In another embodiment, each fan assembly 32, 36 may be disconnected from the power source without disconnecting the other fan assembly 32, 36. Other electrical connections or disconnects may also be provided to facilitate removal, repair, replacement or other service of the fans 34 in a safe manner.

The fans 34 may be mounted in the housings 10, 18 such that each fan may be removed individually, or some or all of the fans may be removed together as a unit. It is desirable for the fans 34 to be replaceable in as little time as possible. It is also desirable for a fan 34 to be replaced without turning off the other fans 34. In one embodiment of the invention, a single fan 34 may be replaced without turning off the other fans 34. In another embodiment, the fans 34 in either the first or second fan assembly 32, 36 may be turned off to replace one of the fans 34 in the fan assembly 32, 36 that has been turned off. In this embodiment, the power to the fan assembly 32, 36 may be turned off, one or more inoperable fans replaced, and the power to the fan assembly 32, 36 restored in less than about three minutes, and during such time the device being cooled may not be turned off. In any embodiment in which one or more inoperable fans 34 are replaced without turning off the device being cooled, a cost savings may be realized.

Figure 2A:
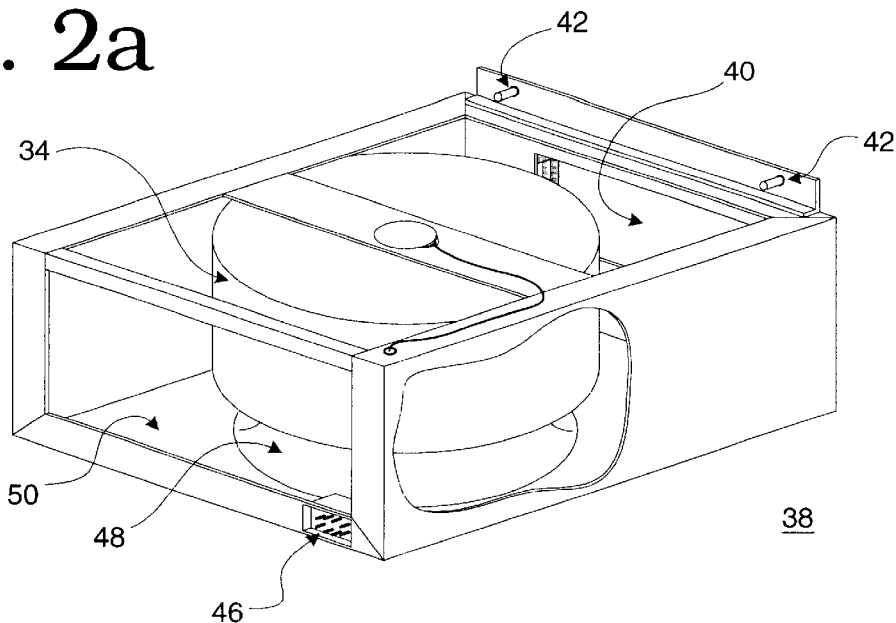
FIG. 2a is a partially cut away view of an embodiment of a modular fan unit.
Figure 2B:
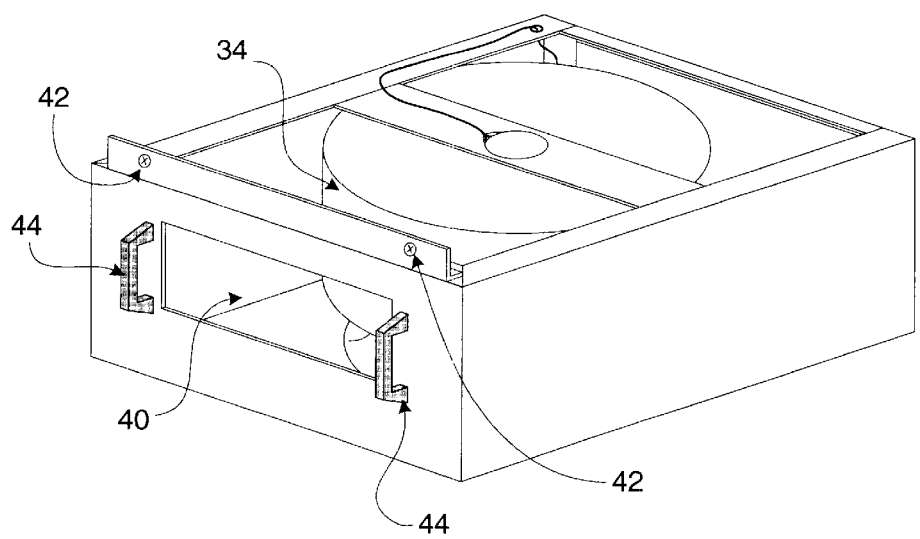
FIG. 2b is another view of an embodiment of a modular fan unit.

In an embodiment of the invention in which each fan 34 may be removed separately from the apparatus, each fan 34 may be mounted in a modular fan unit 38. FIGS. 2a and 2b depict an embodiment of a modular fan unit 38. Modular fan units 38 may be used to improve serviceability, reduce manufacturing cost, improve efficiency, provide flexibility, and provide other benefits. A fan 34 may become inoperable due to the failure of any of several parts. In one embodiment, all of the parts that are likely to cause a fan 34 to fail are mounted in the modular fan unit 38 for each fan 34. In such an embodiment, it is not necessary to diagnose the precise reason for a fan failure before returning the system to full operation. In such an embodiment, there is an improved likelihood that when an inoperable modular fan unit 38 is removed, the defective part will be removed with it, and the system will again be fully operable as soon as the replacement modular fan unit 38 is installed.

In one embodiment, each modular fan unit 38 comprises more than one fan. In such an embodiment, the fans 34 in the modular fan unit 38 may be part of the same fan assembly 32, 36 or different fan assemblies. In one embodiment, each fan assembly 32, 36 comprises two sets of two fans 34, wherein each set of fans may be located in a single modular fan unit 38.

The modular fan units 38 may be constructed in a manner similar to the housings and plenums, as described above. In one embodiment of the invention, each modular fan unit 38 comprises a window 40 through which the fan 34 may be observed during operation. The modular fan units 38, the housings 10, 18, or both, may comprise sealing surfaces or devices to make the connection between the modular fan units 38 and the housings 10, 18 airtight. In one embodiment, the modular fan units comprise one or more fasteners 42 to securely hold the modular fan units in place. In one embodiment, there are two fasteners 42, which may be operated by hand or by using common tools, such as screwdrivers, wrenches, and the like. In another embodiment, the modular fan units 38 may be equipped with handles 44 to facilitate insertion, removal, and carrying of the modular fan units 38.

In one embodiment, the housings 10, 18 comprise mounting racks (not shown) to receive the modular fan units 38. The housings 10, 18 and the modular fan units 38 may be equipped with interacting sliding surfaces, rollers, or other devices to facilitate easy insertion and removal. The modular fan units 38 may also be secured by gravity in a tilted rack, in which the modular fan units 38 are inserted into the housings 10, 18 at an downward angle.

In one embodiment, the housings 10, 18 and the modular fan units 38 comprise integrated electrical connections 46, which create and electrical connection to the modular fan unit 38 when it is installed. Such integrated electrical connections 46 may provide electrical power to the modular fan units 38, and may also connect the modular fan units 38 to various control and feedback circuits. In one embodiment, fault detectors, which signal a central computer when one or more fans 34 become inoperable, are attached to the modular fan units 38 through the integrated electrical connections 46 or other connections.

The modular fan units 38 may comprise various features to enhance the performance of the fans 34. In one embodiment, an inlet cone 48 is disposed between each fan 34 and the floor 50 of each modular fan unit 38. The inlet cones 48 provide optimized airflow to the fans 34, allowing them to operate at a higher efficiency. The modular fan units 38 may also be equipped with other airflow or performance enhancing devices. In one embodiment, the modular fan units 38 are designed to accept various different types and sizes of fans to allow for design flexibility.

Figure 3:
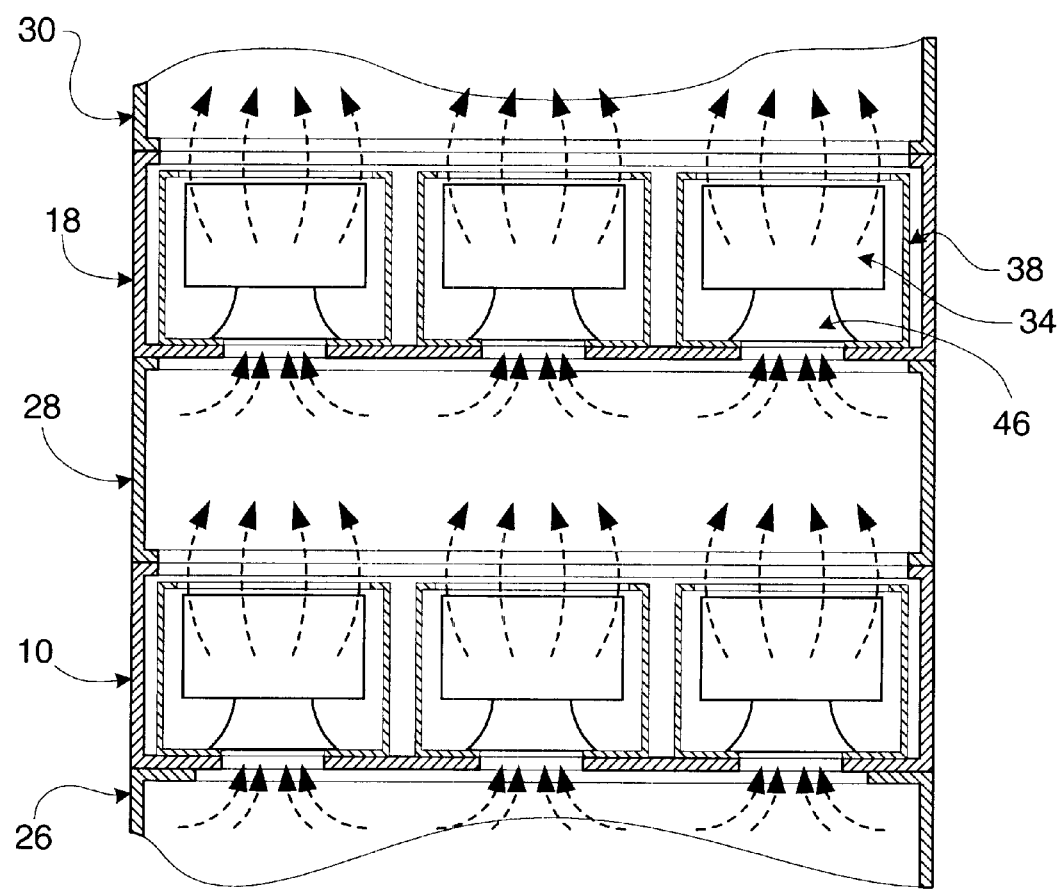
FIG. 3 is a cut away schematic view of the airflow through an embodiment of the present invention.

FIG. 3 is a cut away schematic view of the airflow through an embodiment of the invention with the airflow shown by arrows with dashed lines. The fans 34 of the first fan assembly 32 draw air, which may be in an intake plenum 26, into the first fan housing 10 through the first intake 14, and force the air through the first exhaust 16 into the balancing plenum 28. The fans 34 of the second fan assembly 36 draw the air in the balancing plenum 28 into the second fan housing 20 through the second intake 22, and force the air through the second exhaust 24. The air may then pass into an exhaust plenum 36.

The airflow created by the present invention may be used to cool any number of heat producing or heat conducting devices. In one embodiment, the devices to be cooled may be placed after the second exhaust 24 to provide cooling by blowing air over the devices. In another embodiment, the devices to be cooled may be placed before the first intake 14 to provide cooling by sucking air over the devices. In yet another embodiment, the device to be cooled may be placed in the balancing plenum, between the first exhaust 16 and the second intake 22. In one embodiment of the invention, the apparatus is designed to provide adequate cooling when one or more fans 34 are inoperable.

In one embodiment of the invention, the balancing plenum 28 is designed so that the air pressure in the balancing plenum is relatively uniform in the portion of the balancing plenum 28 that abuts the second intake 22. By providing uniform air pressure, the invention may ensure that each fan 34 is operating under ideal conditions, which may improve the efficiency of the invention. In another embodiment, the balancing plenum 28 is designed so that the air pressure in the balancing plenum is relatively uniform in the portion of the balancing plenum 28 that abuts the second intake 22, even if one of the fans 34 in the first or second fan assembly 32, 36 is inoperable. By providing uniform air pressure to the second intake 22, the balancing plenum 28 may improve the efficiency of the invention.

When one fan 34 in a set of parallel fans become inoperable, there is a possibility that the airflow through the inoperable fan will become reversed, causing some of the air being moved by the remaining fan or fans to recirculate. Such recirculation may substantially reduce the cooling ability of the fans. In order to prevent recirculation, the balancing plenum of the present invention may be designed to provide a constant positive or negative pressure in the balancing plenum.

In previously known parallel fan assemblies, when one fan of an assembly failed, the remaining fans would tend to produce a positive pressure on the exhaust side that would tend to recirculate back or "short circuit" through the inoperable fan and into the negative pressure air on the intake side of the fan assembly, reducing the useful amount of airflow. The recirculation could be substantial because of the relatively high pressure differential between the positive pressure air on the exhaust side and the negative pressure air on the intake side.

Without being limited to any theory of operation, the benefits of the present invention may be understood by the following discussion. It should be understood that other theories may also explain the benefits provided by the present invention. In the present invention, when one fan 34 of the first fan assembly 32 fails, the two remaining fans 34 of the first fan assembly 32 continue to attempt to provide a positive pressure in the balancing plenum 28, however, the three fans 34 of the second fan assembly 36 provide a negative pressure in the balancing plenum 28. The combination of the positive pressure provided by the remaining fans 34 of the first fan assembly 32 and the negative pressure provided by the second fan assembly 36 results in a net negative pressure in the balancing plenum. The pressure differential between the net negative pressure in the balancing plenum 28 and the negative pressure at the intake of the first fan assembly 32 is significantly less that it would be in a known parallel fan assembly, and the amount of recirculated air is correspondingly less.

A similar situation arises when a fan 34 of the second fan assembly 36 becomes inoperable, in such a case, the fans of the fully-operable first fan assembly 32 provide a net positive pressure in the balancing plenum 28, thereby reducing the possibility of recirculation occurring through the inoperable fan 34 of the second fan assembly 36.

In an embodiment of the invention comprising three backward curved impeller fans 34 in each fan assembly 32, 36, it has been found that there is no recirculation when one fan becomes inoperable. Instead, in such an embodiment, the inoperable fan or fans continue to rotate in their proper direction, providing a visual indication that air is continuing to flow in the desired direction through the failed fans. In such an embodiment, it has been found that the electrical device being cooled by the apparatus operates at the same output level with one inoperable fan 34 as it does with no inoperable fans 34.

In another embodiment of the invention, the fans assemblies are designed to provide lower operating noise level. The number, location, and type of fans 34 used in the fan assemblies 32, 36 may selected to provide the same amount of airflow as known fan assemblies, but without being as loud as known fan assemblies. The unique configuration of two sets of parallel fans being arranged in series with one another may provide improved noise characteristics, which is desirable to improve workplace quality and safety.

While the foregoing description includes many details and specificities, it is to be understood that these have been included for purposes of explanation only, and are not to be interpreted as limitations of the present invention. Many modifications to the embodiments described above, such as providing additional fans, fan assemblies, fan housings an balancing plenums, can be made without departing from the spirit and scope of the invention, as is intended to be encompassed by the following claims and their legal equivalents.

What is claimed is:

1. An apparatus for providing a supply of air for cooling electrical devices comprising:
   a first fan housing comprising a first intake, a first exhaust, and a first fan assembly comprising a plurality of fans, each fan being connected to a power supply, wherein the first fan assembly is arranged to provide airflow in a parallel fashion from the first intake to the first exhaust;
   a second fan housing comprising a second intake, a second exhaust, and a second fan assembly comprising a plurality of fans, each fan being connected to a power supply, wherein the second fan assembly is arranged to provide airflow in a parallel fashion from the second intake to the second exhaust;
   a balancing plenum interconnecting the first exhaust and the second intake;
   wherein the apparatus is substantially airtight between the first intake and the second exhaust; and
   wherein the apparatus provides an adequate air supply when at least one fan is inoperable.

2. The apparatus of claim 1, wherein the apparatus provides cooling to high voltage electrical devices.

3. The apparatus of claim 1, wherein the apparatus provides cooling to a power bridge of an exciter.

4. The apparatus of claim 1, wherein the fans are backward curved impeller fans.

5. The apparatus of claim 1, wherein each of the first and second fan assemblies comprises three fans.

6. The apparatus of claim 1, wherein each of the first and second fan assemblies comprises two fans.

7. The apparatus of claim 1, wherein each of the first and second fan assemblies comprises two sets of two fans.

8. The apparatus of claim 1, wherein each fan may disconnected from the power supply and removed or installed without interrupting the power supply to the other fans.

9. The apparatus of claim 1, wherein either of the first and second fan assemblies may be disconnected from the power supply without disconnecting the other fan assembly from the power supply.

10. The apparatus of claim 9, wherein a fan of one of the fan assemblies may be replaced without disconnecting the other fan assembly from the power supply.

11. The apparatus of claim 1, wherein a fan may be replaced without disabling a device being cooled by the apparatus.

12. The apparatus of claim 1, wherein each fan is attached to a separate modular fan unit, each separate modular fan unit comprising:
   a module housing adapted to slidably engage with at least one of the first fan housing or the second fan housing;
   an electrical connector disposed on the module housing and adapted to matingly engage with an electrical power supply connector; and
   one of more fasteners disposed on the module housing and adapted to hold the modular fan unit in at least one of the first fan housing or the second fan housing.

13. The apparatus of claim 1, wherein each fan is attached to a modular fan unit, which may be removed separately from each other modular fan unit.

14. The apparatus of claim 1, further comprising a fault indicator attached to each fan.

15. The apparatus of claim 1, wherein the size of the balancing plenum is selected to provide substantially uniform air pressure within the balancing plenum when one or more fans are disabled.

16. The apparatus of claim 1, wherein the balancing plenum is an integral part of the first fan housing.

17. The apparatus of claim 1, wherein the balancing plenum is an integral part of the second fan housing.

18. The apparatus of claim 1, wherein the first fan housing, balancing plenum, and second fan housing are an integral unit.

19. The apparatus of claim 1, further comprising an intake plenum connected to the first intake.

20. The apparatus of claim 1, further comprising an exhaust plenum connected to the second exhaust.

21. An apparatus for providing a supply of air for cooling electrical power generation devices comprising:
   a first fan housing comprising a first intake, a first exhaust, and a first fan assembly comprising three backward curved impeller fans, each fan being connected to a power supply, wherein the first fan assembly is arranged to provide airflow in a parallel fashion from the first intake to the first exhaust;
   a second fan housing comprising a second intake, a second exhaust, and a second fan assembly comprising three backward curved impeller fans, each fan being connected to a power supply, wherein the second fan assembly is arranged to provide airflow in a parallel fashion from the second intake to the second exhaust;
   a balancing plenum interconnecting the first exhaust and the second intake;
   wherein the apparatus is substantially airtight between the first intake and the second exhaust;
   wherein a fan of the first fan assembly may be replaced without disabling the fans of the second fan assembly;
   wherein a fan of the second fan assembly may be replaced without disabling the fans of the first fan assembly; and
   wherein the apparatus provides an air supply adequate to cool electrical power generation devices when at least one fan is inoperable.

22. The apparatus of claim 21, wherein the apparatus provides cooling to high voltage electrical devices.

23. The apparatus of claim 21, wherein the apparatus provides cooling to a power bridge of an exciter.

24. The apparatus of claim 21, wherein a fan may be replaced without disabling a device being cooled by the apparatus.

25. The apparatus of claim 21, wherein each fan is attached to a separate modular fan unit, each separate modular fan unit comprising:
   a module housing adapted to slidably engage with at least one of the first fan housing or the second fan housing;
   an electrical connector disposed on the module housing and adapted to matingly engage with an electrical power supply connector; and
   one of more fasteners disposed on the module housing and adapted to hold the modular fan unit in at least one of the first fan housing or the second fan housing.

26. The apparatus of claim 21, wherein each fan is attached to a modular fan unit, which may be removed separately from each other modular fan unit.

27. The apparatus of claim 21, further comprising a fault indicator attached to each fan.

28. The apparatus of claim 21, wherein the size of the balancing plenum is selected to provide substantially uniform air pressure within the balancing plenum when one or more fans are disabled.

29. The apparatus of claim 21, wherein the balancing plenum is an integral part of the first fan housing.

30. The apparatus of claim 21, wherein the balancing plenum is an integral part of the second fan housing.

31. The apparatus of claim 21, wherein the first fan housing, balancing plenum, and second fan housing are an integral unit.

32. The apparatus of claim 21, further comprising an intake plenum connected to the first intake.

33. The apparatus of claim 21, further comprising an exhaust plenum connected to the second exhaust.

34. A method for providing a supply of air for cooling electrical devices comprising:
   providing a first fan housing comprising a first intake and a first exhaust;
   locating a first fan assembly comprising a plurality of fans within the first fan housing, wherein the first fan assembly is arranged to provide airflow in a parallel fashion from the first intake to the first exhaust;
   providing a second fan housing comprising a second intake and a second exhaust;
   locating a second fan assembly comprising a plurality of fans within the second fan housing, wherein the second fan assembly is arranged to provide airflow in a parallel fashion from the second intake to the second exhaust;
   interconnecting the first exhaust and the second intake with a substantially airtight balancing plenum;
   connecting each of the fans to a power supply to provide air flow from the first intake, through the first fan housing, through the balancing plenum, through the second fan housing, and out of the second exhaust; and
   positioning the airflow to pass over one or more electrical devices to be cooled.

35. The method of claim 34, wherein the step of positioning the airflow to pass over one or more electrical devices to be cooled comprises positioning the airflow to pass over one or more high voltage electrical devices.

36. The method of claim 34, wherein the step of positioning the airflow to pass over one or more electrical devices to be cooled comprises positioning the airflow to pass over one or more power bridges associated with an exciter.

37. The method of claim 34, wherein the steps of locating fan assemblies comprising a plurality of fans within the first and second fan housings comprises locating fan assemblies comprising a plurality of backward curved impeller fans within the first and second fan housings.

38. The method of claim 34, wherein the steps of locating fan assemblies comprising a plurality of fans within the first and second fan housings comprises locating fan assemblies comprising a three fans within the first and second fan housings.

39. The method of claim 34, wherein the step of connecting each of the fans to a power supply comprises connecting each fan to a power supply such that each fan may disconnected from the power supply and removed or installed without disconnecting all of the connections between the other fans and the power supply.

40. The method of claim 34, further comprising selecting the size and shape of the balancing plenum to provide substantially uniform air pressure within the balancing plenum when one or more fans are disabled.

* * * * *